US009698257B2

United States Patent
Park et al.

(10) Patent No.: US 9,698,257 B2
(45) Date of Patent: Jul. 4, 2017

(54) SYMMETRIC LDMOS TRANSISTOR INCLUDING A WELL OF A FIRST TYPE OF CONDUCTIVITY AND WELLS OF AN OPPOSITE SECOND TYPE OF CONDUCTIVITY

(75) Inventors: Jong Mun Park, Graz (AT); Georg Rohrer, Lebring (AT)

(73) Assignee: AMS AG, Unterpremstatten (AT)

( * ) Notice: Subject to any disclaimer, the term of this patent is extended or adjusted under 35 U.S.C. 154(b) by 52 days.

(21) Appl. No.: 13/808,574

(22) PCT Filed: May 30, 2011

(86) PCT No.: PCT/EP2011/058854
§ 371 (c)(1),
(2), (4) Date: Mar. 20, 2013

(87) PCT Pub. No.: WO2012/004053
PCT Pub. Date: Jan. 12, 2012

(65) Prior Publication Data
US 2013/0207180 A1    Aug. 15, 2013

(30) Foreign Application Priority Data

Jul. 5, 2010  (EP) .................................... 10006920

(51) Int. Cl.
*H01L 29/78*   (2006.01)
*H01L 29/10*   (2006.01)
(Continued)

(52) U.S. Cl.
CPC ...... *H01L 29/7816* (2013.01); *H01L 29/1033* (2013.01); *H01L 29/1045* (2013.01);
(Continued)

(58) Field of Classification Search
CPC ............. H01L 29/1045; H01L 29/7831; H01L 29/7816; H01L 29/4983
(Continued)

(56) References Cited

U.S. PATENT DOCUMENTS 4,714,519 A * 12/1987 Pfiester ......................... 438/304
6,359,298 B1   3/2002 Krishnan
(Continued)

FOREIGN PATENT DOCUMENTS

WO         02/09184 A2    1/2002

OTHER PUBLICATIONS

Macary et al., "A Novel LDMOS Structure with High Negative Voltage Capability for Reverse Battery Protection in Automotive IC's", BIPOLAR/BICMOS Circuits and Technology Meeting, 2000: Proceedings of the 2000, Sep. 24-26, 2000, Piscataway, NJ, USA, IEEE, Sep. 24, 2000, pp. 90-93.

*Primary Examiner* — Marcos D Pizarro
(74) *Attorney, Agent, or Firm* — McDermott Will & Emery LLP (57) ABSTRACT

The symmetric LDMOS transistor comprises a semiconductor substrate (1), a well (2) of a first type of conductivity in the substrate, and wells (3) of an opposite second type of conductivity. The wells (3) of the second type of conductivity are arranged at a distance from one another. Source/drain regions (4) are arranged in the wells of the second type of conductivity. A gate dielectric (7) is arranged on the substrate, and a gate electrode (8) on the gate dielectric. A doped region (10) of the second type of conductivity is arranged between the wells of the second type of conductivity at a distance from the wells. The gate electrode has a gap (9) above the doped region (10), and the gate electrode overlaps regions that are located between the wells (3) of the second type of conductivity and the doped region (10).

7 Claims, 7 Drawing Sheets

(51) Int. Cl.
*H01L 29/49* (2006.01)
*H01L 29/66* (2006.01)
*H01L 29/06* (2006.01)

(52) U.S. Cl.
CPC .... *H01L 29/4983* (2013.01); *H01L 29/66484* (2013.01); *H01L 29/66537* (2013.01); *H01L 29/66568* (2013.01); *H01L 29/7831* (2013.01); *H01L 29/7836* (2013.01); *H01L 29/0649* (2013.01); *H01L 29/0653* (2013.01); *H01L 29/0692* (2013.01)

(58) Field of Classification Search
USPC ................ 257/E29.051, E29.264, 365, 343
See application file for complete search history.

(56) References Cited

U.S. PATENT DOCUMENTS

| | | | |
|---|---|---|---|
| 7,910,441 B2* | 3/2011 | Yang et al. | 438/275 |
| 7,910,991 B2* | 3/2011 | Yang et al. | 257/341 |
| 8,063,443 B2* | 11/2011 | Cai | 257/335 |
| 8,410,557 B2* | 4/2013 | Yoneda et al. | 257/409 |
| 2007/0212838 A1 | 9/2007 | Ivanov et al. | |
| 2008/0121997 A1 | 5/2008 | Yang et al. | |
| 2009/0256200 A1 | 10/2009 | Yao et al. | |
| 2011/0115019 A1* | 5/2011 | Giles et al. | 257/341 |

* cited by examiner

SYMMETRIC LDMOS TRANSISTOR INCLUDING A WELL OF A FIRST TYPE OF CONDUCTIVITY AND WELLS OF AN OPPOSITE SECOND TYPE OF CONDUCTIVITY

BACKGROUND

Symmetric high-voltage p-channel LDMOS transistors show a high on-resistance compared to that of asymmetric p-channel LDMOS transistors. This is mainly due to the large cell-pitch and the large channel-length of the device. In general, the punch-through behavior between two p-drift regions is the limiting factor regarding a reduction of the channel-length.

Furthermore, a low threshold voltage of symmetric high-voltage p-channel transistors is desired and achieved by a relatively low doping concentration of the body well. The low doping concentration between the two p-drift regions increases the danger of a punch-through. Therefore, the minimal channel-length of the symmetric p-channel LDMOS transistor is typically much larger than that of an asymmetric p-channel LDMOS tranistor.

If the body-well doping is not to be increased, a reduction of the channel-length is only possible by a reduction of the depth of the p-well defining the p-drift region or by an implantation of a relatively low dose of p-dopants forming a lightly doped drain. These methods are avoided because they are not in accordance with the conventional production processes or require dedicated process steps.

SUMMARY

It is an object of the present invention to provide a symmetric LDMOS transistor having a low on-resistance and a good punch-through behavior. It is a further object to present a method of production of such a transistor.

These objects are achieved with the symmetric LDMOS transistor according to claim 1 and with the method of producing a symmetric LDMOS transistor according to claim 11, respectively. Embodiments and variants derive from the dependent claims.

The symmetric LDMOS transistor comprises a semiconductor substrate, a well of a first type of conductivity in the substrate, and wells of an opposite second type of conductivity in the well of the first type of conductivity. The wells of the second type of conductivity are arranged at a distance from one another and comprise source/drain regions. A gate dielectric is arranged on the substrate, and a gate electrode is arranged on the gate dielectric. A doped region of the second type of conductivity is arranged in the well of the first type of conductivity between the wells of the second type of conductivity at a distance from the wells of the second type of conductivity. The gate electrode has a gap above the doped region of the second type of conductivity, and the gate electrode overlaps regions of the well of the first type of conductivity that are located between the wells of the second type of conductivity and the doped region of the second type of conductivity.

The first type of conductivity may be n-type conductivity and the second type of conductivity p-type conductivity. In this case the symmetric LDMOS transistor is a p-channel LDMOS transistor. Instead, the first type of conductivity may be p-type conductivity and the second type of conductivity n-type conductivity. In the latter case the symmetric LDMOS transistor is an n-channel LDMOS transistor.

In an embodiment of the symmetric LDMOS transistor the doped region of the second type of conductivity and the source/drain regions are more highly doped than the wells of the second type of conductivity.

In a further embodiment of the symmetric LDMOS transistor a shallow well of the first type of conductivity is arranged in the well of the first type of conductivity, and the doped region of the second type of conductivity is arranged in the shallow well.

In a further embodiment of the symmetric LDMOS transistor the shallow well is arranged between the wells of the second type of conductivity at a distance from the wells of the second type of conductivity.

A further embodiment of the symmetric LDMOS transistor comprises a silicide or metal region on the doped region of the second type of conductivity.

In a further embodiment of the symmetric LDMOS transistor, drift regions are located in the wells of the second type of conductivity, and isolation regions are embedded in the wells of the second type of conductivity. The isolation regions are arranged between the source/drain regions and above the drift regions.

In a further embodiment of the symmetric LDMOS transistor the gate electrode comprises a conductive region of the second type of conductivity adjacent to the gap and a conductive region of the first type of conductivity.

In a further embodiment of the symmetric LDMOS transistor, a body contact region is connected with the well of the first type of conductivity and arranged between areas of the doped region of the second type of conductivity. A body contact is applied to the body contact region, and source/drain contacts are applied to the source/drain regions.

In a further embodiment of the symmetric LDMOS transistor the body contact region is a strip region, which is arranged at the same distance from the wells of the second type of conductivity and divides the doped region of the second type of conductivity.

In a further embodiment of the symmetric LDMOS transistor, the body contact region comprises a series of contact islands, which are arranged on a straight line at the same distance from the wells of the second type of conductivity. An interconnecting doped region of the second type of conductivity may be provided for the doped region of the second type of conductivity and may be located between the contact islands.

The method of producing a symmetric LDMOS transistor comprises the steps of forming a well of a first type of conductivity in a semiconductor substrate and forming wells of an opposite second type of conductivity in the well of the first type of conductivity, so that the wells of the second type of conductivity are arranged at a distance from one another. An implantation of dopants is performed, whereby a doped region of the second type of conductivity is produced in the well of the first type of conductivity. The doped region of the second type of conductivity is arranged between the wells of the second type of conductivity at a distance from the wells of the second type of conductivity. Source/drain contacts are applied to the wells of the second type of conductivity. A gate dielectric and a gate electrode are arranged above regions of the well of the first type of conductivity that are located between the wells of the second type of conductivity and the doped region of the second type of conductivity. The gate electrode is provided with a gap above the doped region of the second type of conductivity.

In a variant of the method, the implantation of dopants, whereby the doped region of the second type of conductivity is produced, is also used to produce source/drain regions in the wells of the second type of conductivity. The source/ drain regions are thus more highly doped than the wells of the second type of conductivity. There may be standard LDD implantations together with the formation of the doped region of the second type of conductivity.

The gate electrode may be formed to have a conductive region of the first type of conductivity, and the implantation of dopants may also be provided for the formation of a conductive region of the second type of conductivity of the gate electrode adjacent to the gap.

A further variant of the method comprises an implantation of a shallow well of the first type of conductivity in the well of the first type of conductivity, and the doped region of the second type of conductivity is arranged in the shallow well.

A further variant of the method comprises an implantation of dopants forming a body contact region, which is connected with the well of the first type of conductivity and arranged between areas of the doped region of the second type of conductivity. A body contact is applied to the body contact region.

BRIEF DESCRIPTION OF THE DRAWINGS

The following is a detailed description of examples of the symmetric LDMOS transistor and of appertaining methods of production in conjunction with the appended figures.

DETAILED DESCRIPTION

Figure 1:
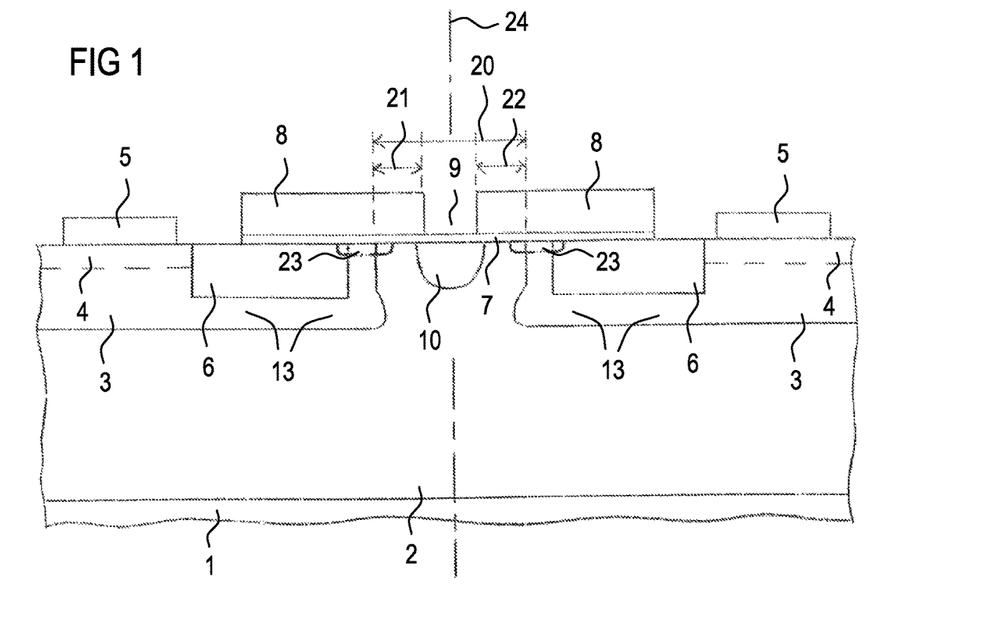
FIG. 1 shows a cross-section of an embodiment of the symmetric LDMOS transistor.

FIG. 1 shows a cross-section of an embodiment of the symmetric high-voltage LDMOS transistor. The first type of conductivity may be n-type or p-type, whence the opposite second type of conductivity is p-type or n-type, respectively. To be specific, a p-channel LDMOS transistor is described in the following, but the same description applies to n-channel LDMOS transistors if the types of conductivities are exchanged throughout.

A semiconductor substrate 1, which may be p-conducting, is provided with an n-well 2. This is preferably a deep n-doped well. Two p-wells 3 are arranged in the n-well 2 at a distance from one another. The p-wells 3 are provided for source and drain and comprise drift regions 13. The distance between the p-wells 3 essentially defines the maximal channel-length 20 of the transistor. Source/drain regions 4 are arranged in the p-wells 3 at an upper surface of the substrate 1. The source/drain regions 4 have a higher doping concentration than the p-wells 3 and are provided with source/drain contacts 5 forming source/drain terminals.

Isolation regions 6 are arranged at the surface of the substrate 1 adjacent to the source/drain regions 4 in the direction towards the channel region. The isolation regions 6 have a smaller depth than the p-wells 3 and may be shallow trench isolations (STI), for example. The portions of the p-wells 3 that are located under the isolation regions 6 form the drift regions 13. The region of the n-well 2 between the p-wells 3 is provided as channel region. In sections of the p-wells 3 that are adjacent to the channel region, LDD implants 23 may be provided to form lightly doped drain regions. But it is not necessary to have LDD implants 23, because the doping concentration in this region can be controlled by the design of the p-well 3.

Contrary to conventional symmetric LDMOS transistors, a p-doped region 10 is arranged in the n-well 2 at the location of the channel. The p-doped region 10 is arranged between the p-wells 3 at a distance 21, 22 from the p-wells 3. The regions between the p-doped region 10 and the p-wells 3 each form a section of the channel, so that the sum of the distances 21, 22 corresponds to the effective channel length.

The channel region is covered with a gate dielectric 7, on which the gate electrode 8 is arranged. The gate electrode 8 has a gap 9 above the p-doped region 10. The position of the plane 24 of symmetry is indicated in the cross-section of FIG. 1.

The channel region of the transistor according to FIG. 1 is split into two sections, each located between the p-doped region 10 and one of the p-wells 3. The overall effective channel length can thus be adjusted by the dimension of the p-doped region 10.

Figure 2:
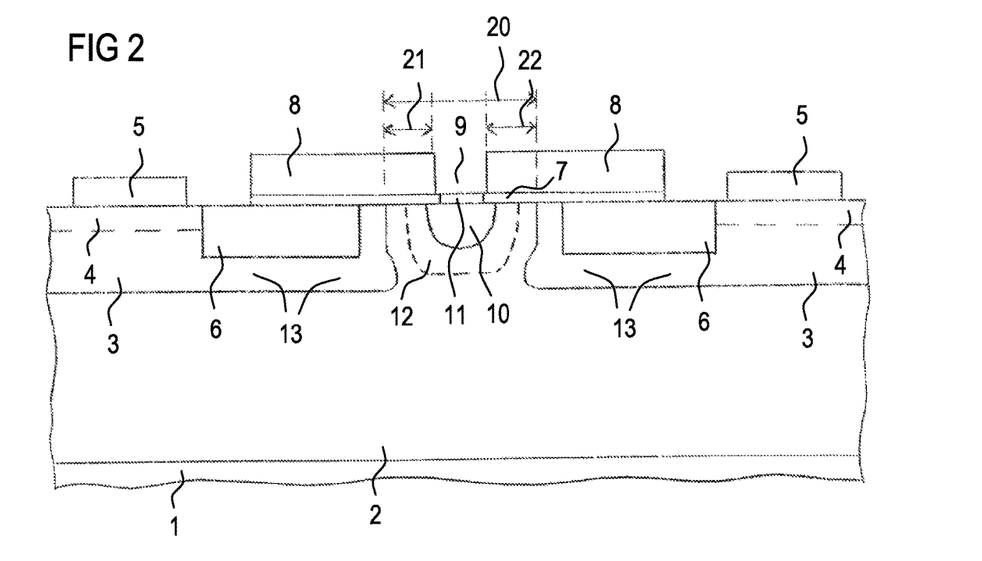
FIG. 2 shows a cross-section of a further embodiment comprising an additional shallow well and comprising a silicide or metal region on the doped region that is located between sections of the channel region.

FIG. 2 shows a cross-section of a further embodiment comprising two additional features, which are independent of each other. Like elements are designated with the same reference numerals as in FIG. 1. The embodiment according to FIG. 2 is provided with a shallow n-well 12 within the deep n-well 2. The p-doped region 10 is arranged in the shallow n-well 12. By means of the shallow n-well 12, the doping concentration of the n-well 2 is preferably increased in the region around the p-doped region 10. The shallow n-well 12 thus further inhibits the occurrence of a punch-through.

FIG. 2 shows a further feature, which is independent of the presence of the shallow n-well 12. This further feature relates to a silicide or a metal region 11 interrupting the layer of the gate dielectric 7 in the area of the gap 9 of the gate electrode 8. The silicide or metal region 11 forms an electric conductor parallel to the p-doped region 10 and thus reduces the resistance between the sections of the channel essentially. In this way, the on-resistance of the transistor can be essentially reduced.

Figure 3:
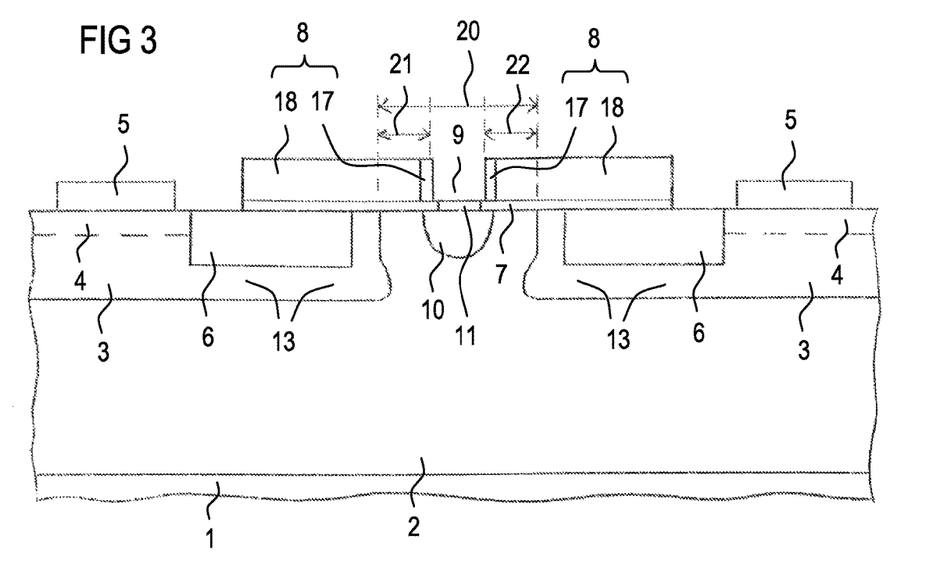
FIG. 3 shows a cross-section of a further embodiment comprising a silicide or metal region on the doped region that is located between sections of the channel region and comprising a gate electrode having n-conductive and p-conductive regions.

FIG. 3 shows a cross-section of a further embodiment, wherein the gate electrode 8 comprises a p-conductive region 17 adjacent to the gap 9 and an n-conductive region 18. The gate electrode 8 may be polysilicon, which may be provided with a basic n-conductivity. When the p-doped region 10 is formed by an implantation of p-dopants, the polysilicon gate electrode 8 can be used as a mask. The regions of the gate electrode 8 that are adjacent to the gap 9 are also doped with p-dopants and thus the p-conductive region 17 is formed. On each side of the gap 9 the length of the p-conductive region 17 should be shorter than the distance 21, 22 between the p-doped region 10 and the p-well 3. The n-conductive region 18 and the doping concentration of the n-well 2 and the additional shallow n-well 12, if provided, together determine the threshold voltage. In the embodiment according to FIG. 3, a silicide or metal region 11 may also be provided on the p-doped region 10, similar to the embodiment of FIG. 2.

Figure 4:
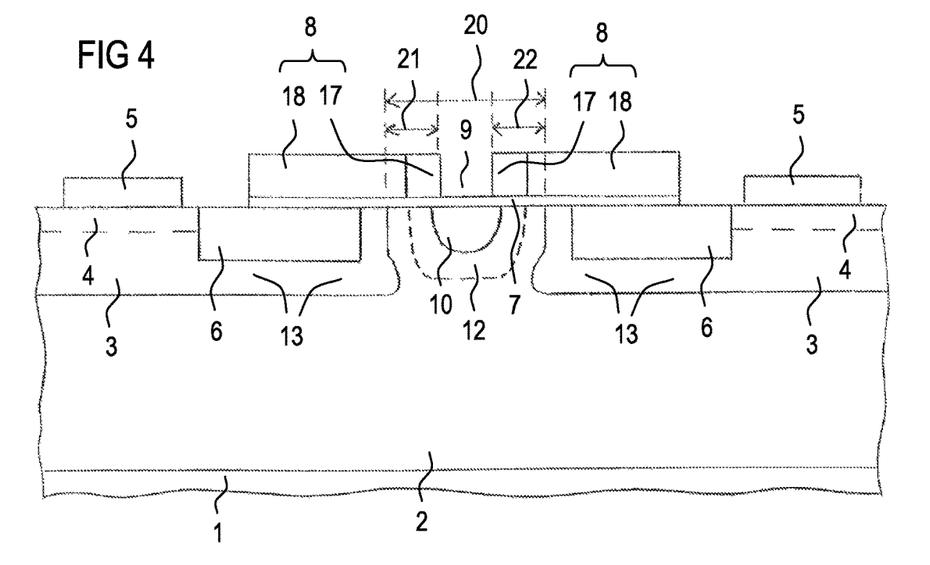
FIG. 4 shows a cross-section of a further embodiment comprising an additional shallow well and comprising a gate electrode having n-conductive and p-conductive regions.

FIG. 4 shows a cross-section of a further embodiment, which comprises another combination of the additional features of the embodiments according to FIGS. 2, 3 and 4. The embodiment according to FIG. 4 is provided with a shallow n-well 12. In this example, there is no silicide or metal region 11 above the p-doped region 10, but this additional feature may be provided in the embodiment of FIG. 4 as well. The gate electrode 8 comprises a p-conductive region 17 and an n-conductive region 18. The length of the p-conductive region 17 is here larger than the length of the p-conductive region 17 of the embodiment according to FIG. 3. The length of the p-conductive region 17 can be adjusted by the implantation mask used to form the p-doped region 10. FIG. 4 illustrates how the additional features that were described in conjunction with FIGS. 2 to 4 can be combined in different ways according to the requirements of individual embodiments.

Figure 5:
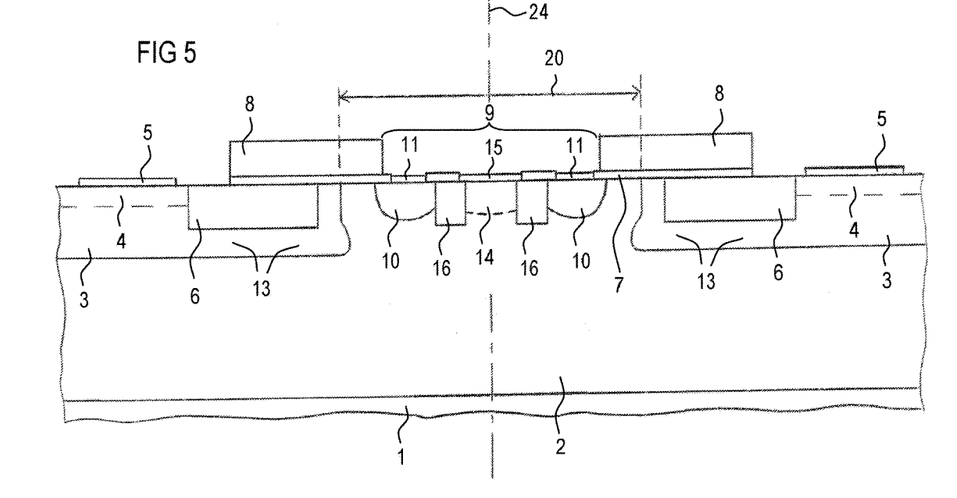
FIG. 5 shows a cross-section of a further embodiment comprising a body contact region between areas of the doped region that is located between sections of the channel region.

FIG. 5 shows a cross-section of a further embodiment, in which there is a body contact region 14 arranged at the centre between areas of the p-doped region 10. The p-doped region 10 and the body contact region 14 may be separated from one another by an additional isolation region 16. A connection between the sections of the p-doped region 10 is favorable and can be achieved by an external connection via a metallization belonging to a wiring or by an interconnecting p-doped region within the semiconductor material. The p-doped region 10 may be provided with a silicide or metal region 11 applied on the surface of the semiconductor material. The body contact region 14 may be provided with a body contact 15, which may be a metal, for example. The silicide or metal region 11 and the body contact are separated by portions of the gate dielectric 7. In this embodiment, a pnp latch-up is suppressed. Furthermore, the area occupied by the device is reduced, because there is no need to place a body contact on the n-well 2 outside the active area of the transistor.

Figure 6:
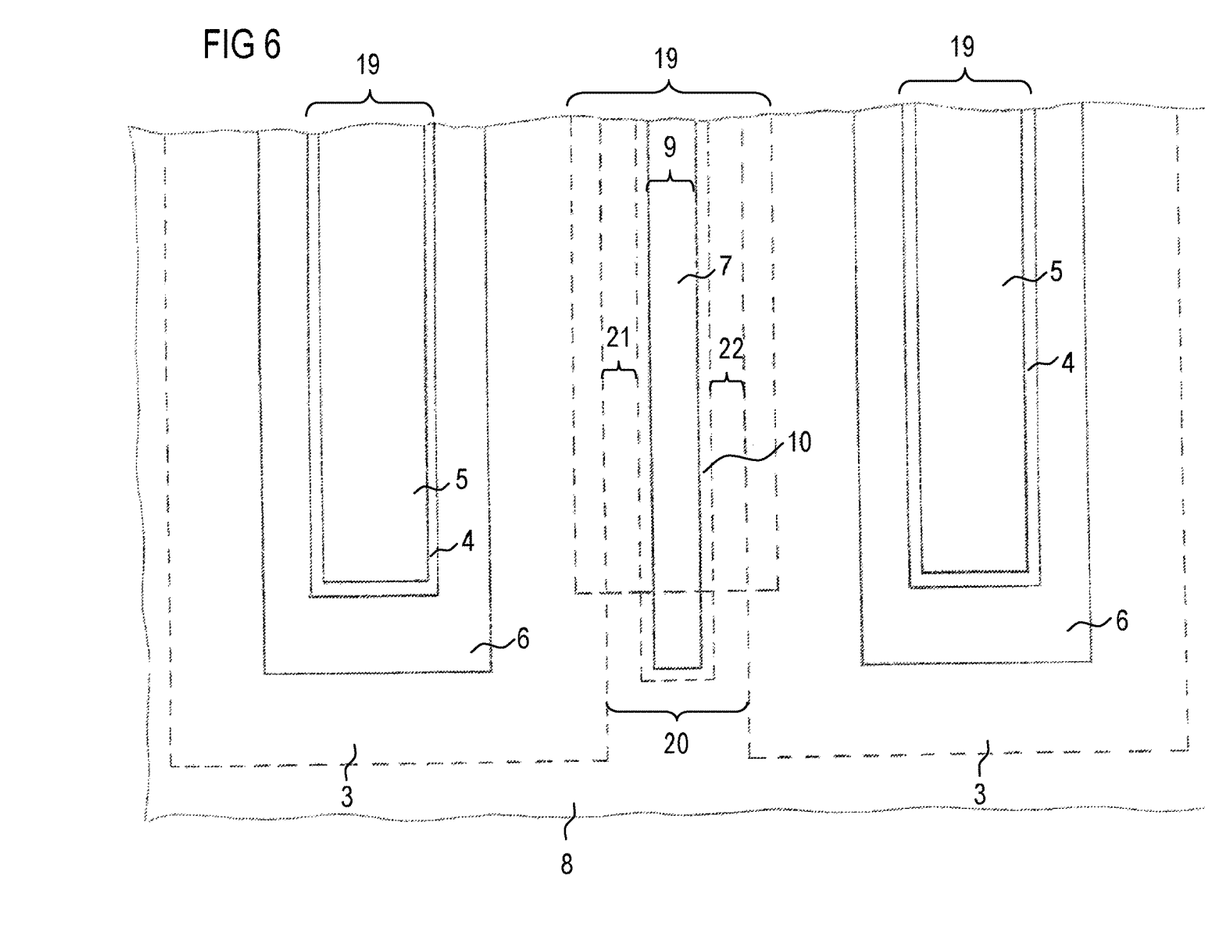
FIG. 6 shows a plan view of the embodiment according to FIG. 1.

FIG. 6 shows a plan view of the embodiment according to FIG. 1. A major portion of the surface of the substrate 1 is occupied by the gate electrode 8. FIG. 6 shows the gap 9 above the p-doped region 10 between sections of the channel. In the gap 9 the gate dielectric 7 is not covered by the gate electrode 8. The effective channel length is determined by the distances 21, 22 between the p-doped region 10 and the p-wells 3. The lateral boundaries of the p-doped region 10 are shown as hidden contours with broken lines. The positions of the p-wells 3 are also shown with broken lines indicating the lateral boundaries of the p-wells 3, which are arranged at a distance 20 from one another. The source/drain regions 4 are shown to carry source/drain contacts 5. FIG. 6 also shows the locations of the active region 19.

Figure 7:
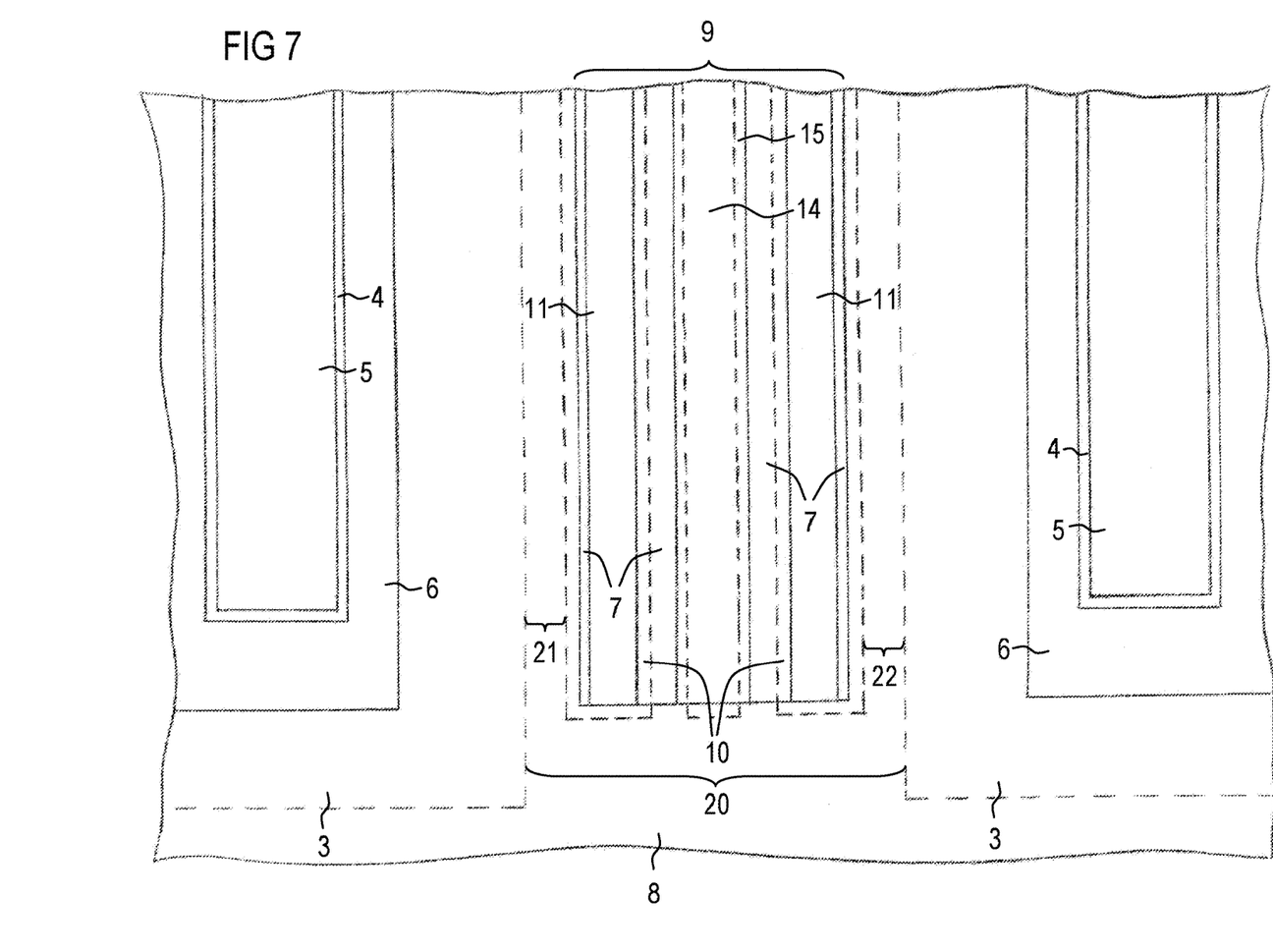
FIG. 7 shows a plan view of an embodiment according to FIG. 5.

FIG. 7 shows a plan view of an embodiment according to FIG. 5. The p-doped region 10 is formed by two strips of doped semiconductor material. In this embodiment the body contact region 14 is formed as a strip region between the strips of the p-doped region 10. The p-doped region 10 and the body contact region 14 are preferably separated from one another by isolation regions 16 (cf. FIG. 5), which may be shallow trench isolations, for example. The hidden contours of the p-doped region 10 and the body contact region 14 are represented with broken lines. FIG. 7 also shows the positions of the gate dielectric 7, the silicide or metal region 11 on the p-doped region 10, and the body contact 15. The strips of the silicide or metal region 11 may be electrically connected via a metallization of a wiring, for instance.

Figure 8:
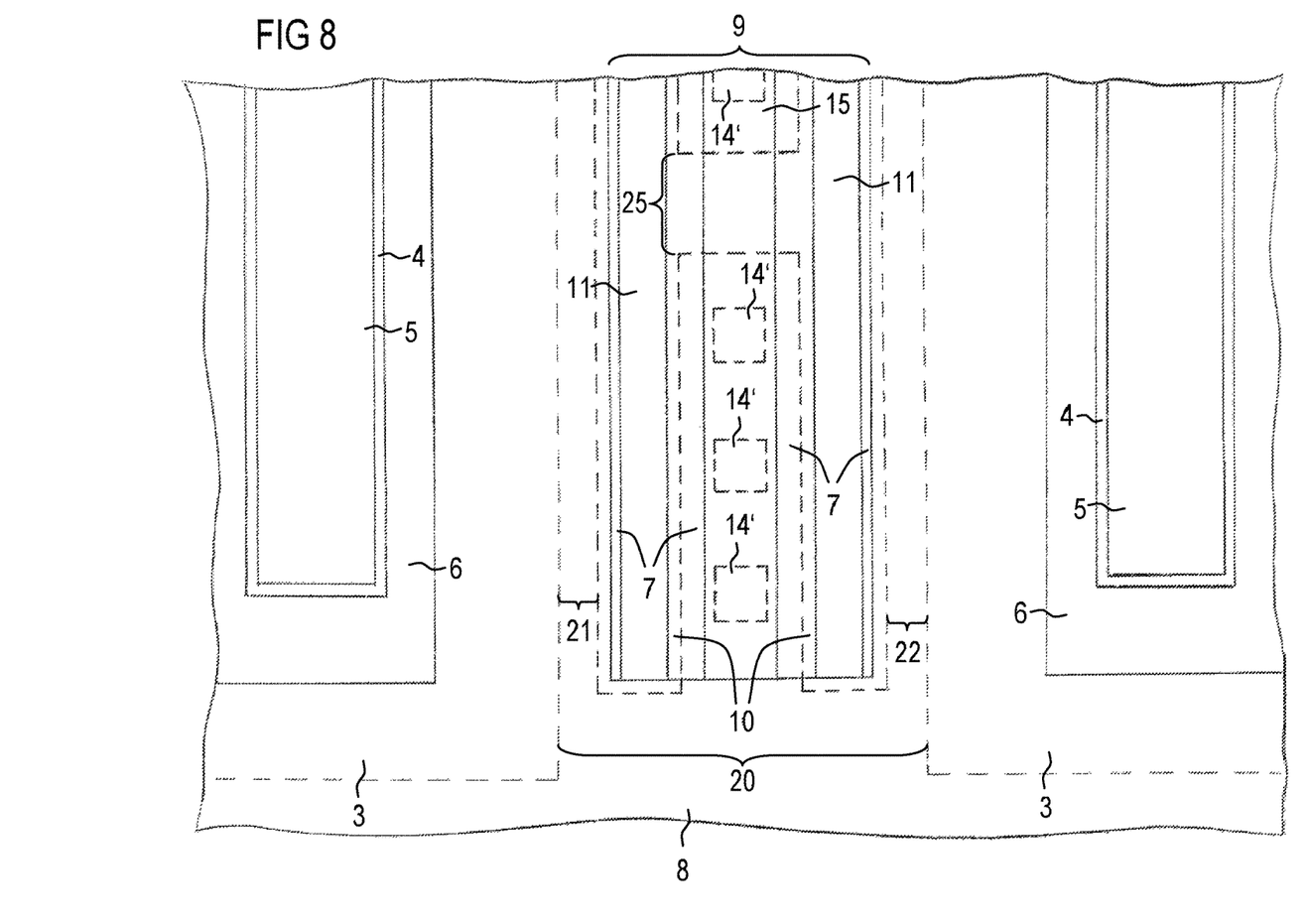
FIG. 8 shows a plan view of another embodiment according to FIG. 5.

FIG. 8 shows a further embodiment in a plan view according to FIG. 7. The embodiment according to FIG. 8 comprises a body contact region 14' formed by individual contact islands, which are separated from one another. The portions of the p-doped region 10 are electrically conductively connected by at least one interconnecting p-doped region 25, which is arranged between two contact islands of the body contact region 14'. The body contact 15 may be applied as a metallic strip, which is simultaneously applied to all the contact islands of the body contact region 14'.

Figure 9:
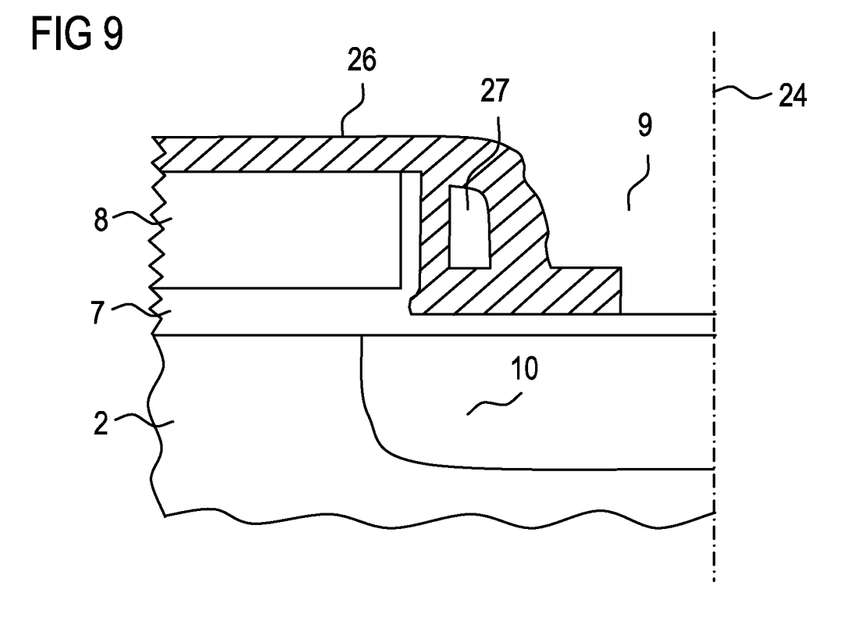
FIG. 9 shows a detail of the cross-section according to FIG. 1.

FIG. 9 shows a detail of the cross-section of FIG. 1 encompassing a portion of the well 2 of the first type of conductivity, the gate dielectric 7, the gate electrode 8, the gap 9, and the doped region 10 of the second type of conductivity. The vertical broken line on the right indicates the plane of symmetry. The gate electrode 8 may be a polysilicon gate. There may additionally be a silicide on top of the polysilicon gate. In the example shown in FIG. 9, the gate electrode 8 is covered with a cover layer 26, which may be a nitride, for instance. The cover layer 26 may comprise an inclusion 27, which may be formed by an oxide, for instance. In the embodiment according to FIG. 9, the gate dielectric 7 is also present in the gap 9 above the doped region 10 and thus covers the whole surface area of the doped region 10. The gate dielectric 7 may instead be interrupted in the area of the gap 9 by a silicide or metal region 11 as in the embodiment according to FIG. 2.

Figure 10:
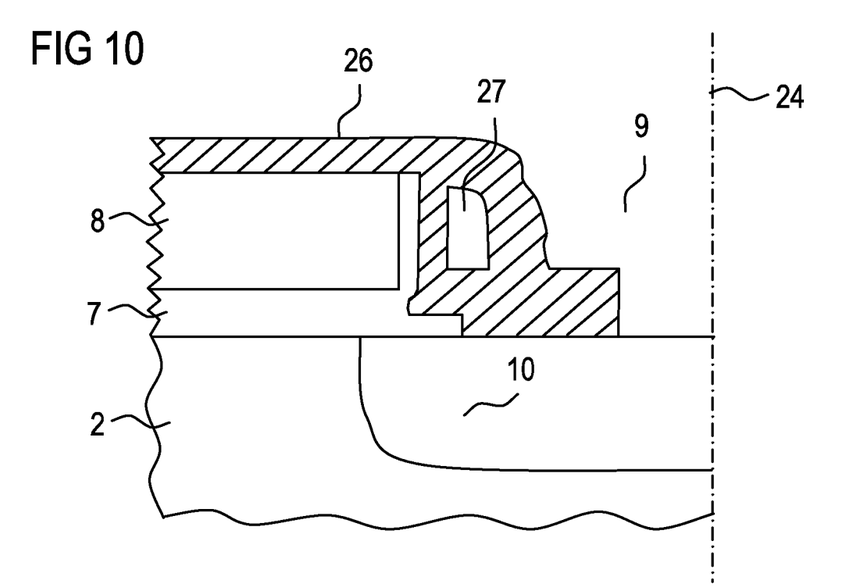
FIG. 10 shows the detail according to FIG. 9 for another embodiment.

FIG. 10 shows the detail according to FIG. 9 for another embodiment. The detail shown in FIG. 10 also encompasses a portion of the well 2 of the first type of conductivity, the gate dielectric 7, the gate electrode 8, the gap 9, and the doped region 10 of the second type of conductivity. Contrary to the embodiment according to FIG. 9, the gate dielectric 7 of the embodiment according to FIG. 10 is not present in the whole area of the gap 9, so that a major surface area of the doped region 10 is not covered with the gate dielectric 7.

The symmetric LDMOS transistor according to the invention allows to reduce the minimum channel length within a standard production technology. The punch-through breakdown voltage is high and the on-resistance is low compared to conventional symmetric LDMOS transistors. The advantages of the invention may be especially appreciated in symmetric p-channel LDMOS transistors.

LIST OF REFERENCE NUMERALS 1 substrate
2 well of the first type of conductivity
3 well of the opposite second type of conductivity
4 source/drain region
5 source/drain contact
6 isolation region
7 gate dielectric
8 gate electrode
9 gap
10 doped region of the second type of conductivity
11 silicide or metal region
12 shallow well
13 drift region 14 body contact region, strip region
14' body contact region, contact island
15 body contact
16 isolation region
17 conductive region of the second type of conductivity
18 conductive region of the first type of conductivity
19 active region
20 distance, maximal channel length
21 distance, section of the effective channel length
22 distance, section of the effective channel length
23 LDD implant
24 plane of symmetry
25 interconnecting doped region
26 cover layer
27 inclusion

The invention claimed is:

1. A symmetric LDMOS transistor, comprising:
a semiconductor substrate;
a well of a first type of conductivity in the substrate;
wells of an opposite second type of conductivity in the well of the first type of conductivity, the wells of the second type of conductivity being arranged at a distance from one another;
source/drain regions in the wells of the second type of conductivity;
a gate dielectric on the substrate;
a gate electrode on the gate dielectric;
a doped region of the second type of conductivity in the well of the first type of conductivity, the doped region of the second type of conductivity comprising areas separated from one another and being arranged between the wells of the second type of conductivity at a distance from the wells of the second type of conductivity;
a gap of the gate electrode above the doped region of the second type of conductivity, the gate electrode overlapping regions of the well of the first type of conductivity that are located between the wells of the second type of conductivity and the doped region of the second type of conductivity; and
a body contact region connected with the well of the first type of conductivity and arranged between the areas of the doped region of the second type of conductivity,
wherein the gap of the gate electrode is arranged above the body contact region,
wherein the areas of the doped region of the second type of conductivity and the wells of the second type of conductivity are arranged symmetrically with respect to the body contact region,
wherein the body contact region is a strip region arranged at the same distance from the wells of the second type of conductivity and divides the doped region of the second type of conductivity, and
wherein a connection between the areas of the doped region of the second type of conductivity is provided by an external connection via a metallization belonging to a wiring.

2. A symmetric LDMOS transistor, comprising:
a semiconductor substrate;
a well of a first type of conductivity in the substrate;
wells of an opposite second type of conductivity in the well of the first type of conductivity, the wells of the second type of conductivity being arranged at a distance from one another;
source/drain regions in the wells of the second type of conductivity;
a gate dielectric on the substrate;
a gate electrode on the gate dielectric;
a doped region of the second type of conductivity in the well of the first type of conductivity, the doped region of the second type of conductivity comprising areas separated from one another and being arranged between the wells of the second type of conductivity at a distance from the wells of the second type of conductivity;
a gap of the gate electrode above the doped region of the second type of conductivity, the gate electrode overlapping regions of the well of the first type of conductivity that are located between the wells of the second type of conductivity and the doped region of the second type of conductivity;
a body contact region connected with the well of the first type of conductivity and arranged between the areas of the doped region of the second type of conductivity,
wherein the gap of the gate electrode is arranged above the body contact region,
wherein the areas of the doped region of the second type of conductivity and the wells of the second type of conductivity are arranged symmetrically with respect to the body contact region,
wherein the body contact region comprises a series of contact islands arranged on a straight line at the same distance from the wells of the second type of conductivity, and
wherein a connection between the areas of the doped region is provided by interconnecting doped region of the second type of conductivity, which is provided for the doped region of the second type of conductivity and is located between the contact islands.

3. The symmetric LDMOS transistor of claim 1 or 2, further comprising:
drift regions located in the wells of the second type of conductivity; and
isolation regions embedded in the wells of the second type of conductivity,
the isolation regions being arranged between the source/drain regions and above the drift regions.

4. The symmetric LDMOS transistor of claim 1 or 2, further comprising:
a conductive region of the second type of conductivity within the gate electrode adjacent to the gap; and
a conductive region of the first type of conductivity within the gate electrode at a distance from the gap.

5. The symmetric LDMOS transistor of claim 1 or 2, further comprising:
isolation regions separating the areas of the doped region of the second type of conductivity from the body contact region.

6. The symmetric LDMOS transistor of claim 1 or 2, wherein a silicide or metal region is arranged on the doped region of the second type of conductivity, and the gap of the gate electrode is arranged above the silicide or metal region.

7. The symmetric LDMOS transistor of claim 6, wherein the silicide or metal region comprises portions separated by the body contact.

* * * * *